(12) United States Patent
Den Boef et al.

(10) Patent No.: US 8,593,646 B2
(45) Date of Patent: Nov. 26, 2013

(54) MEASURING METHOD, MEASURING APPARATUS, LITHOGRAPHIC APPARATUS AND DEVICE MANUFACTURING METHOD

(75) Inventors: Arie Jeffrey Den Boef, Waalre (NL); Marcel Hendrikus Maria Beems, Veldhoven (NL); Theodorus Petrus Maria Cadee, Vlierden (NL); Raymond Wilhelmus Louis Lafarre, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 63 days.

(21) Appl. No.: 13/369,614

(22) Filed: Feb. 9, 2012

(65) Prior Publication Data

US 2012/0212749 A1    Aug. 23, 2012

Related U.S. Application Data (60) Provisional application No. 61/444,373, filed on Feb. 18, 2011, provisional application No. 61/468,208, filed on Mar. 28, 2011.

(51) Int. Cl.
*G01B 11/14* (2006.01)
*G01B 11/00* (2006.01)

(52) U.S. Cl.
CPC .............. *G01B 11/14* (2013.01); *G01B 11/00* (2013.01)
USPC .......................................... 356/614; 356/399

(58) Field of Classification Search
CPC ............................... G01B 11/24; G01B 11/00
USPC ................. 356/614–624, 399–401, 445–448
See application file for complete search history.

(56) References Cited

U.S. PATENT DOCUMENTS

| | | | |
|---|---|---|---|
| 6,297,876 B1 | 10/2001 | Bornebroek | |
| 6,897,956 B2 | 5/2005 | Noguchi et al. | |
| 6,961,116 B2 | 11/2005 | Den Boef et al. | |
| 7,341,822 B2 * | 3/2008 | Van Der Sande | 430/311 |
| 7,440,079 B2 | 10/2008 | Den Boef et al. | |
| 7,570,358 B2 | 8/2009 | Den Boef | |
| 2009/0195768 A1 | 8/2009 | Bijnen et al. | |
| 2010/0201963 A1 | 8/2010 | Cramer et al. | |
| 2012/0212718 A1 | 8/2012 | Den Boef | |

FOREIGN PATENT DOCUMENTS

| | | |
|---|---|---|
| JP | 06-302499 A | 10/1944 |
| JP | 61-080215 A | 4/1986 |
| JP | 02-232918 A | 9/1990 |

(Continued)

*Primary Examiner* — Michael P Stafira
(74) *Attorney, Agent, or Firm* — Sterne, Kessler, Goldstein & Fox P.L.L.C.

(57) ABSTRACT

An apparatus (AS) measures positions of marks (202) on a lithographic substrate (W). A measurement optical system comprises illumination subsystem (504) for illuminating the mark with a spot of radiation (206) and as detecting subsystem (580) for detecting radiation diffracted by the mark. The substrate and measurement optical system move relative to one another at a first velocity ($v_W$) so as to scan the mark while synchronously moving the spot of radiation relative to the reference frame (RF) of the measurement optical system at a second velocity ($v_{SPOT}$). The spot scans the mark at a third velocity ($v_{EFF}$) which is lower than the first velocity to allow more time for accurate position measurements to be acquired. In one embodiment, an objective lens (524) remains fixed in relation to the reference frame while a moving optical element (562) imparts the movement of the radiation spot relative to the reference frame.

18 Claims, 5 Drawing Sheets

(56) References Cited

FOREIGN PATENT DOCUMENTS

| | | |
|---|---|---|
| JP | 2003-247807 A | 9/2003 |
| JP | 2005-268237 A | 9/2005 |
| JP | 2006-114919 A | 4/2006 |
| JP | 2008-263187 A | 10/2008 |
| JP | 2009-047460 A | 3/2009 |
| JP | 2009-186555 A | 8/2009 |
| JP | 2010-192894 A | 9/2010 |
| JP | 2012-175103 A | 9/2012 |
| JP | 2012-191177 A | 10/2012 |

* cited by examiner

MEASURING METHOD, MEASURING APPARATUS, LITHOGRAPHIC APPARATUS AND DEVICE MANUFACTURING METHOD

CROSS REFERENCE TO RELATED APPLICATIONS

This application is related to U.S. Provisional Patent Application No. 61/444,373, filed Feb. 18, 2011, and to U.S. Provisional Patent Application No. 61/468,208, filed Mar. 28, 2011, which are incorporated by reference herein in their entirety.

BACKGROUND

1. Field of Invention

The invention relates in general to a measuring method, a lithographic apparatus, a substrate and a method for manufacturing a device.

2. Related Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In order to control the lithographic process to place device features accurately on the substrate, alignment marks are generally provided on the substrate, and the lithographic apparatus includes one or more alignment sensors by which positions of marks on a substrate must be measured accurately. The time taken for these measurements conflicts with the need to maximize throughput of the lithographic apparatus, otherwise device production will not be cost-effective. Various types of alignment sensors and marks are known, including for example the ones disclosed in patents U.S. Pat. No. 6,297,876 (Bornebroek), U.S. Pat. No. 6,961,116 (den Boef) and in published patent application US 2009195768 A (Bijnen et al). In each of these examples, the position measurement is captured by moving the substrate and the alignment sensor relative to one another, without the substrate and sensor having to be brought to a stop. The position of the mark relative to the (known) position of the alignment sensor is measured optically, by scanning the marks with an optical spot. (It does not matter whether the sensor moves while the substrate is stationary, or only the substrate moves, or both move.) The alignment sensors should scan the marks as quickly as possible for optimum throughput, but this need for Speed places limits on the accuracy of the position measurements that can be obtained. It is inherently more difficult to acquire a position accurately in a short time, I addition, a measurement acquired in a short time, even if the measurement itself is perfectly accurate, will be susceptible to disturbance by dynamic positioning errors (vibrations, servo errors etc.) in the positioning of the substrate and alignment sensor.

SUMMARY

According to a first aspect, the invention enables measurement of substrate position more accurately without degrading throughput of the alignment sensor. The inventors have recognized that it is possible to lengthen the acquisition time for each individual measurement, without slowing the operation of the alignment process overall.

According to an aspect of the invention there is provided a method of measuring a position of a mark on a substrate in an optical apparatus, the method comprising:

providing a mark on the substrate;

providing a measurement optical system comprising an illumination subsystem for illuminating the mark with a spot of radiation and a detecting subsystem for detecting radiation diffracted by the mark;

in a scanning operation moving the substrate and the measurement optical system relative to one another at a first velocity so as to scan the mark with the spot of radiation while detecting and processing signals representing the diffracted radiation to calculate a position of the mark relative to a reference frame of the measurement optical system;

synchronously with said scanning operation moving the spot of radiation relative to the reference frame of the measurement optical system at a second velocity, the first and second velocities being related such that the spot scans the mark at a third velocity which is lower than the first velocity while said signals are detected.

The reduced third velocity allows a longer time for acquisition of the measured position, while the higher first velocity allows the overall throughput for a large number of position measurements to be maintained.

The radiation spot relative to the reference frame of the measurement optical system may be is imparted by a low mass moving optical element within the measurement optical system.

The invention further provides an apparatus for measuring positions of marks on a substrate, the apparatus comprising:

a measurement optical system comprising an illumination subsystem for illuminating the mark with a spot of radiation and a detecting subsystem for detecting radiation diffracted by the mark;

a first positioning subsystem for controlling movement of the substrate and measurement optical system relative to one another at a first velocity so as to scan the mark with the spot of radiation while detecting and processing signals representing the diffracted radiation to calculate a position of the mark relative to a reference frame of the measurement optical system;

a second positioning subsystem operable synchronously with the first positioning subsystem for moving the spot of radiation relative to the reference frame of the measurement optical system at a second velocity, the first and second velocities being related such that the spot scans the mark at a third velocity which is lower than the first velocity while said signals are detected.

The invention also provides a lithographic apparatus arranged to transfer a pattern from a patterning device onto a substrate, the apparatus comprising a substrate table constructed to hold a substrate and an alignment sensor for measuring the positions of marks on the substrate relative to a reference frame of the lithographic apparatus, wherein the alignment sensor comprises a measuring apparatus according to the invention as set forth above, and wherein the lithographic apparatus is arranged to control the transfer of a pattern onto the substrate by reference to the positions of marks on the substrate measured using said measuring apparatus.

The invention also provides a method of manufacturing a device in which a lithographic process is used to transfer a pattern from a patterning device onto a substrate, and wherein the transfer of a pattern onto the substrate is controlled by reference to positions of marks on the substrate measured using a method according to the invention as set forth above.

Embodiments of the invention described below include a tilting optical element arranged in a particular manner that has application in apparatus besides the measuring apparatus of the first aspect of the invention se forth above. The applicants reserve the right to claim that arrangement independently, whether in this application or another application deriving priority from it.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
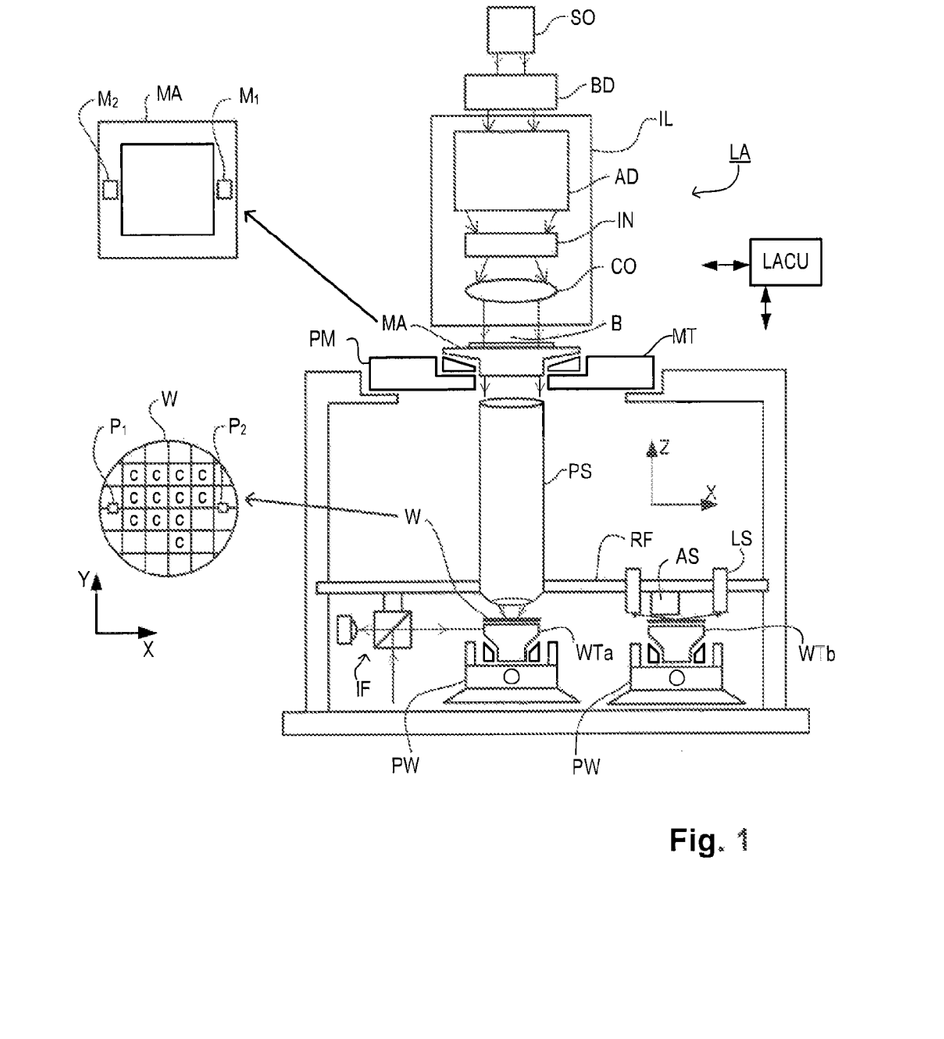
FIG. 1 depicts an exemplary lithographic apparatus including an alignment sensor forming measuring apparatus according to an embodiment of the invention.

FIG. 1 schematically depicts a lithographic apparatus according to one embodiment of the invention. The apparatus comprises:
 an illumination system (illuminator) IL configured to condition a radiation beam B (e.g. UV radiation or EUV radiation).
 a support structure (e.g. a mask table) MT constructed to support a patterning device (e.g. a mask) MA and connected to a first positioner PM configured to accurately position the patterning device in accordance with certain parameters;
 a substrate table (e.g. a wafer table) WTa or WTb constructed to hold a substrate (e.g. a resist-coated wafer) W and connected to a second positioner PW configured to accurately position the substrate in accordance with certain parameters; and
 a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

Figure 10A:
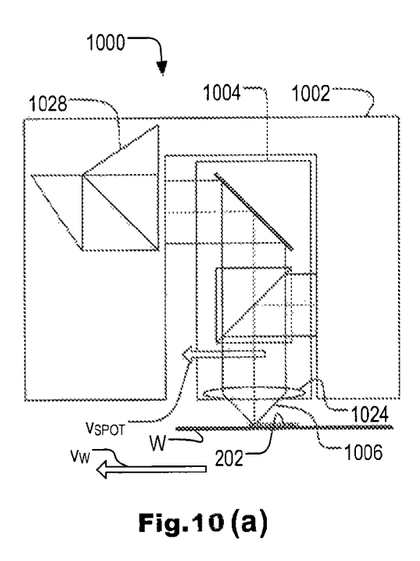
FIGS. 10(a) and 10(b) are schematic diagrams of yet another novel alignment sensor forming a measuring apparatus in a further alternative embodiment of the present invention.
Figure 10B:
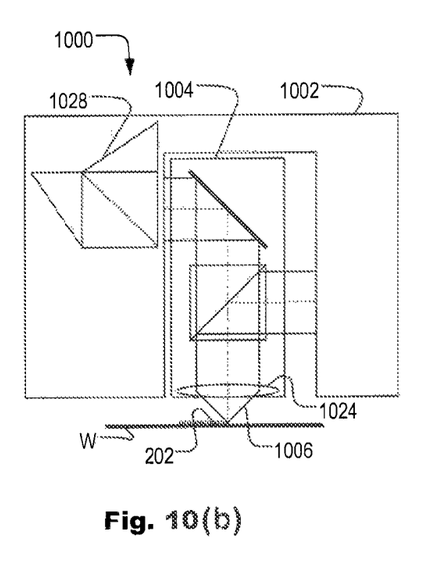

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure. An example will be described below, with reference to FIG. 10. The invention disclosed herein can be used in a stand-alone fashion, but in particular it can provide additional functions in the pre-exposure measurement stage of either single- or multi-stage apparatuses.

The lithographic apparatus may also be of a type wherein at least a portion of the substrate may be covered by a liquid having a relatively high refractive index, e.g. water, so as to fill a space between the projection system and the substrate, An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

The illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the mask table MT and the substrate table WTa/WTb are scanned synchronously while a pattern imparted to the radiation beam is projected onto a target portion C (i.e. a single dynamic exposure). The velocity and direction of the substrate table WTa/WTb relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two substrate tables WTa and WTb and two stations—an exposure station and a measurement station—between which the substrate tables can be exchanged. While one substrate on one substrate table is being exposed at the exposure station, another substrate can be loaded onto the other substrate table at the measurement station so that various preparatory steps may be carried out. The preparatory steps may include mapping the surface of the substrate using a level sensor LS and measuring the position of alignment markers on the substrate using an alignment sensor AS. This enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2A:
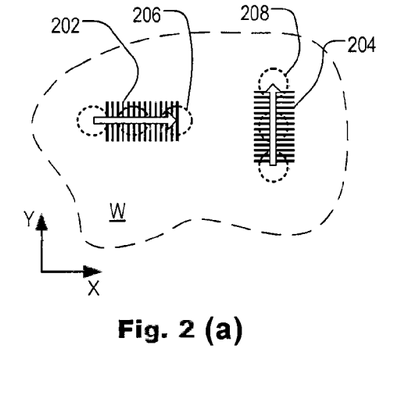
FIGS. 2(a) and 2(b) illustrate various forms of an alignment mark that may be provided on a substrate in the apparatus of FIG. 1.
Figure 2B:
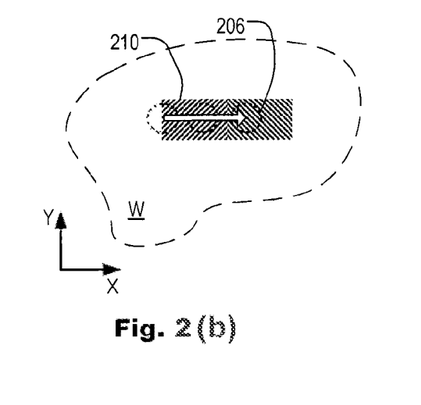

FIGS. 2(a) and 2(b) show examples of alignment marks 202, 204, provided on substrate W for the measurement of X-position and Y-position, respectively. Each mark in this example comprises a series of bars formed in a product layer or other layer applied to or etched in to the substrate. The bars on the X-direction mark 202 are parallel to the Y-axis, while the bars of the Y-direction mark 204 are parallel to the X-axis. The alignment sensor AS (shown in FIG. 1) scans each mark optically with a spot 206, 208 of radiation, to measure the position of substrate W relative to the apparatus. The scanning movement is indicated schematically by a broad arrow, with progressive positions of the spot 206 or 208 indicated in dotted outline. The pitch of the bars in the alignment pattern is typically much greater than the pitch of product features to be formed on the substrate, and the alignment sensor AS uses a wavelength of radiation (or usually plural wavelengths) much longer than the exposure radiation to be used for applying patterns to the substrate. Fine position information can be obtained, however, because the large number of bars allows the phase of the repeating pattern to be accurately measured.

Coarse and fine marks may be provided, so that the alignment sensor can calculate which cycle of the pattern is at a given position, as well as the exact position (phase) within that cycle. Marks of different pitches can also be used for this purpose. These techniques are again well known to the person skilled in the art, and will not be detailed herein. The design and operation of such sensors is well known in the art, and each lithographic apparatus has its own design of sensor. For the purpose of the present description, it will be assumed that the alignment sensor AS comprises an alignment system of the form described in U.S. Pat. No. 6,961,116 (den Boef). FIG. 2(b) shows a modified mark for use with a similar alignment system, which X- and Y-positions can be obtained through a single scan. The mark 210 has bars arranged at 45 degrees to both the X- and Y-axes. This combined X- and Y-measurement can be performed using the techniques described in published patent application US 2009195768 A (Bijnen et al), the contents of which are incorporated herein by reference. It may be noted that U.S. Pat. No. '768 discloses some embodiments in which the X-Y alignment marks have portions of different pitches, somewhat similar to the marks newly presented in the present application. However, the simpler mark shown in FIG. 2(b) is the form generally used in the commercial embodiment, and any moiré effect that may be observed between different pitches in the embodiments of U.S. Pat. No. '768 is fixed and provides no measure of process performance.

Figure 3:
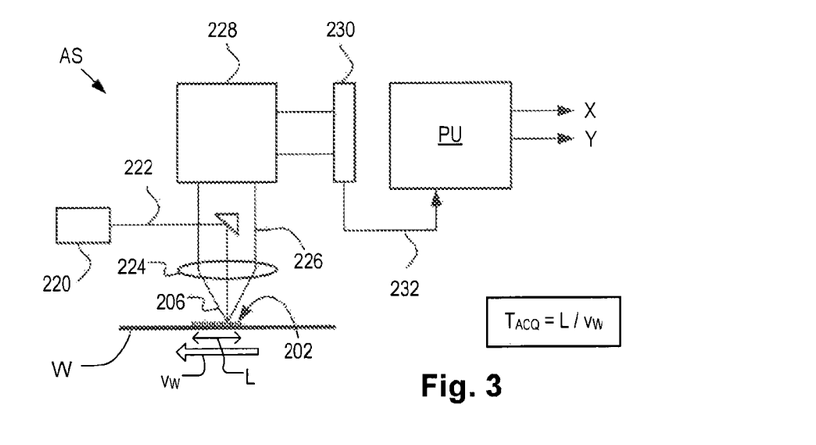
FIG. 3 is a schematic block diagram of a known alignment sensor scanning an alignment mark.

FIG. 3 is a schematic block diagram of alignment sensor AS. Illumination source 220 provides a beam 222 of radiation of one of more wavelengths, which is diverted through an objective lens 224 onto mark such as mark 202, located on substrate W. As indicated schematically in FIGS. 2(a) and 2(b), in the example of the present alignment sensor based on U.S. Pat. No. 6,961,116, mentioned above, the illumination spot 206 by which the mark 202 is illuminated may be slightly smaller in diameter then the width of the mark itself Radiation scattered by mark 202 is picked up by objective lens 224 and collimated into an information-carrying beam 226. A self-referencing interferometer 228 processes beam 226 and outputs separate beams onto a sensor array 230. Intensity signals 232 from individual sensors in sensor grid 230 are provided to a processing unit PU. By a combination of the optical processing in the block 228 and the computational processing in the unit PU, values for X- and Y-position on the substrate relative to the sensor are output. Processing unit PU may be separate from the control unit LACU shown in FIG. 1, or they may share the same processing hardware, as a matter of design choice and convenience. Where unit PU is separate, part of the signal processing may be performed in the unit PU and another part in unit LACU.

The particular measurement illustrated only fixes the position of the mark within a certain range corresponding to one pitch of the mark. Coarser measurement techniques are used in conjunction with this to identify which period of the sine wave is the one containing the marked position. The same process at coarse and/or fine level can be repeated at different wavelengths for increased accuracy, and for robust detection of the mark irrespective of the materials from which the mark is made, and on which it sits. The wavelengths can be multiplexed and demultiplexed optically so as to be processed simultaneously, and/or they may be multiplexed by time division. Examples in the present disclosure will refer to one measurement at one wavelength only, and the skilled reader can readily appreciate the modifications required to expand that teaching to provide a partial and robust measurement apparatus (alignment sensor).

An arrow labeled $v_W$ in FIG. 3 illustrates a scanning velocity with which spot 206 traverses the length L of mark 202. In this example, the alignment sensor AS and spot 206 in reality remain stationary, while it is the substrate W that moves with velocity $v_W$. The alignment sensor can thus be mounted rigidly and accurately to the reference frame RF (FIG. 1), while effectively scanning the mark 202 in a direction opposite to the direction of movement of substrate W. The substrate is controlled in this movement by its mounting on the substrate table WT and the substrate positioning system PW. As discussed in the introduction, the high productivity requirements required of the expensive lithographic apparatus require the measurement of the alignment marks at numerous positions on the substrate be performed as quickly as possible, which implies that the scanning velocity $v_W$ is fast, and the time $T_{ACQ}$ available for acquisition of each marked position is correspondingly short. In simplistic terms, the formula $T_{ACQ}=L/v_W$ applies.

Unfortunately, shortness of the acquisition time can lead to inaccuracy in the measured positions x and y. This is not only because of difficulties in the measurement process itself, but also because the acquisition time becomes too short to smooth out dynamic positioning errors in the movement of the substrate table WT and substrate W which is supported on it. These dynamic positioning errors, which may be thought of simplistically as vibrations, are referred to in the art as MSD error (MSD stands for moving standard deviation). To smooth out these MSD errors, one could repeat the measurement and use the average result, but this defeats the object of increasing throughput, because it increases the measurement time overall. In summary, there are competing factors that limit the accuracy that can be achieved in the known type of scanning alignment sensor. In a novel arrangement disclosed herein, spot 206 is caused to make scanning movements relative to the alignment sensor and reference frame, so that the acquisition time can be lengthened without slowing the operation overall. This technique will now be described in more detail.

Figure 4A:
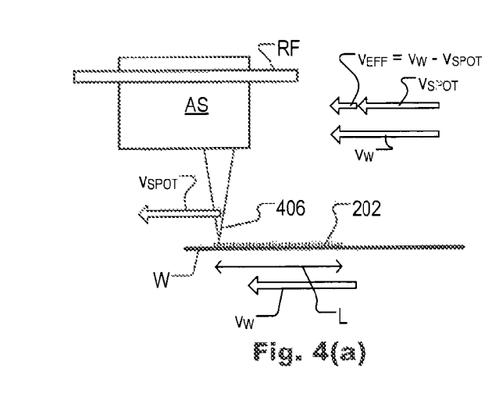
FIGS. 4(a) and 4(b) illustrate the operation of a novel alignment sensor scanning an alignment mark, in an embodiment of the present invention.
Figure 4B:
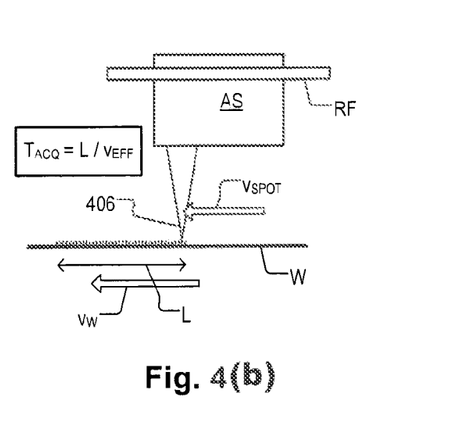

FIGS. 4(a) and 4(b) respectively illustrate the start and the end of a scanning operation of a modified alignment sensor AS on the mark 202, which is conveniently the same mark as described previously. The length of the mark is again L and the substrate W again moves under the alignment system with a velocity $v_W$. In this modified operation, however, the illumination spot 406 or, more generally the point on the mark 202 which is being read by the alignment sensor at any given moment during the scanning operation, is controlled to move relative to the reference frame RF with a velocity $v_{SPOT}$. This spot velocity $v_{SPOT}$ is somewhat less than the substrate velocity $v_W$. The effect of this optical scanning movement of spot 406 is that the effective velocity $v_{EFF}$ of scanning, which is the difference between the substrate velocity $v_w$ and the spot velocity $v_{SPOT}$, is much smaller than the substrate velocity itself. Consequently the acquisition time $T_{ACQ}=L/v_{EFF}$ is longer than would be implied by the overall scanning velocity. This allows the accuracy of position measurements on mark 202 to be increased, particularly to smooth out MSD error, without increasing the overall measurement time.

Naturally, there are limits to how great an effect of lengthening the acquisition time is achievable or desirable. These depend primarily on the optical properties of the alignment sensor optical system, which much have a field of view (FOV) wide enough to cover the whole scanning movement, and which must have a certain uniformity, stability and/or predictability of response across all spot positions. A practical arrangement will now be described, with reference to FIG. 5.

Figure 5:
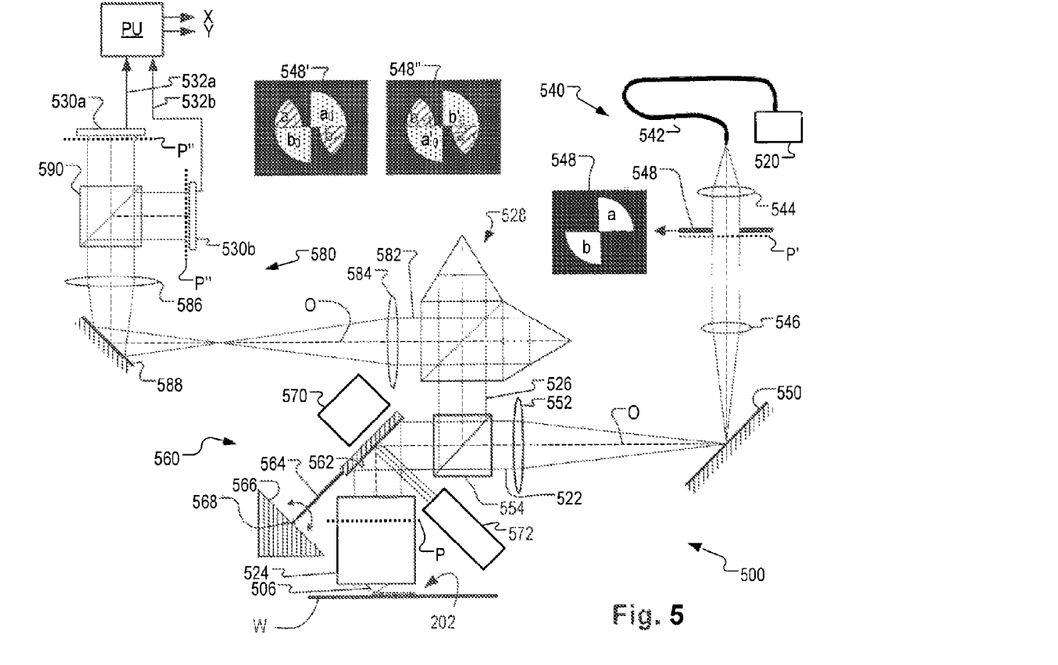
FIG. 5 is a more detailed exemplary schematic diagram showing the optical system of the novel alignment sensor in the lithographic apparatus of FIG. 1.

FIG. 5 illustrates an optical system 500 of a modified alignment sensor implementing the scanning spot whose principle of operation has been illustrated and described above with reference to FIG. 4. Optical system 500 is a modified version of the system described in the prior publication, U.S. Pat. No. 6,961,116, mentioned above. A first modification, particularly relevant for the present application, is the above mentioned scanning illumination spot. A second modification is the use of a particular segmented illumination mode which, among other things, allows a reduced pitch of alignment mark for greater accuracy, and which allows scatterometry type measurements to be performed with the alignment sensor, rather than a separate scatterometer instrument. A further modification can be made based on the disclosure of publication US 2009/195768, also mentioned above, so that simultaneous measurement of X and Y position can be made. For the purpose of the present description, it shall be assumed that measurement of position is made in or e direction only.

For ease of comparison with the schematic diagram of FIG. 3, some parts of the optical system 500 are labeled with reference signs similar to those used in FIG. 3, but with prefix "5" instead of "2". Thus, we see a light source 520, an illumination beam 522, an objective lens 524, an information carrying beam 526, an interferometer 528 and detectors 530a and 530b. Signals 532a and 532b from these detectors are processed by processing unit PU, which is modified as appropriate to implement the novel features described below. An optical axis O which has several branches is indicated by a broken line running throughout the optical system 500. Additional components illustrated in this more detailed schematic are as follows. In an illumination subsystem 540, radiation from source 520 is delivered via an optical fiber 542 to a point where it enters an optical system comprising lenses 544 and 546. Of course, where each lens is illustrated schematically by a single element, a practical embodiment may include groups of elements in practice or reflective optical elements may also be used. Between lenses 544 and 546, the beam is parallel, and passes through a plane P', which is a back-projection of the pupil plane P of objective lens 524. A fixed or configurable illumination aperture 548 is provided in this plane, to allow specific modes of illumination, such as the symmetric, segmented illumination pattern illustrated in FIG. 5. Two diametrically opposite quadrants, labeled a and b, are bright in this aperture pattern (transparent), while the other two quadrants are dark (opaque). This type of aperture is known in scatterometry apparatus, from our patent application US 2010/201963. The merits of this modified illumination aperture will be described further below. After diffraction by a fixed mirror 550 and collimation by a lens 552, illumination beam 522 is delivered from the illumination subsystem 540 to a beam splitter 554, which separates the illumination beam 522 from the information-carrying beam 526, just as in the known instrument.

Unlike in the known alignment sensor, however, the illumination beam 522 and information-carrying beam 526 do not travel to and from the substrate W directly through objective 524 to the substrate W in a fixed manner. Rather, in this modified apparatus, a scanning subsystem 560 is interposed between objective 524 and the remainder of the optical system 500, for causing illumination spot 506 to implement a scanning movement additional to the scanning movement of the substrate W itself. This scanning movement is the one with the velocity $v_{SPOT}$, indicated for spot 406 in the schematic diagrams of FIGS. 4(a) and 4(b). Scanning subsystem 560 in this embodiment is based on a moving, specifically tilting mirror 562, which deflects the beams 522 and 526 through a small, variable angle. Mirror 562 is mounted ot an arm 564 which is connected to a support 566 at a hinge point 568, so as to pivot to a desired angle among a range of angles. An actuator 570, which may be for example a magnetic actuator having no mechanical contact with mirror 562 or its support, causes movement of the mirror 562 to desired angles so as to move spot 506 to a desired position for the scanning movement. In the present embodiment, arm 564 and hinge point 568 implement with the mirror 562 a mass-and-spring vibration system, having a natural resonant frequency, as explained further below. In such an embodiment, actuator 570 can provide only a very slight energy input at an appropriate frequency, to cause a smooth oscillation of the mirror at a relatively well-defined frequency. A tilt sensor 572 is provided to monitor the tilt angle accurately, by optical measurement. Actuator 570 is under control of a controller (which may be part of unit PU), which receives also the signals from tilt sensor 572 and which is synchronized with the measurement operations of the alignment sensor generally, including the scanning movements of substrate table WT through positioning subsystem PW.

Further detail of the scanning subsystem 560 will be described further below, with reference to FIGS. 6-8. Information-carrying beam 526 passes into interferometer 528 in the same manner as the known alignment sensor of U.S. Pat. No. 6,961,116. Interferometer 528 is shown in a simplified, two-dimensional arrangement, but in fact comprises a three-dimensional arrangement of prisms and other elements, as described in the prior patent. Similarly, polarizing elements that are part of the interferometer are omitted here, for clarity.

The function of self-referencing interferometer 528, as in the known example, is to receive the information-carrying beam 526, to split it into two equal parts, to rotate these parts by 180° relative to one another, and combine these parts again into an outgoing beam 582. The beam 582 is directed to a detecting subsystem 580. The lenses 584 and 586 together with a fixed deflecting mirror 588 deliver this beam to detectors 530a and 530b via polarizing beam splitter 590.

Beam splitter 590 produces two interference patterns that are in anti-phase with each other. Thus, if the interferometer 528 produces destructive interference at one point on detector 530a, there will be constructive interference at the corresponding point on the detector 530b at the same time. By subtracting the signals from the two detectors, one can reduce the influence of common-mode intensity noise, and so obtain a more accurate output from the alignment sensor as a whole.

Whereas, in the known alignment sensor of FIG. 3, detectors 230 are placed in an image plane corresponding to the plane of substrate W, the detectors 530a and 530b in the modified optical system 500 are positioned in a plane P''', which is conjugate with the pupil plane P of objective 524. Each detector 530a and 530b in this example is an image sensor, for example a CCD camera sensor. In alternative embodiments, individual point detectors may be deployed instead of image sensors. In either case, the radiation field at plane P''' is not an image of the substrate, but a diffraction spectrum of the mark 202, conjugated with the illumination aperture 548. In this type of detection system, the alignment signals required to obtain positional information of the mark 202 can still be obtained, but additionally the pupil plane images detected by detectors 530a and 530b can be used to analyze additional properties of the mark or other features on substrate W, to perform scatterometry. For example, asymmetry of alignment and/or Overlay targets can be analyzed, which facilitates measurement of overlay error between device layers, for example. A benefit of using the alignment sensor to measure target asymmetry, rather than a separate instrument, is that positioning errors between the alignment sensor and the overlay measurement apparatus are eliminated.

While the illumination pattern provided by aperture 548 has bright quadrants labeled a and b in FIG. 5, the diffraction pattern resulting from diffraction by the lines of the alignment marked 202 in a given direction is represented by the pattern at 548'. In this pattern, in addition to zero order reflections labeled $a_0$ and $b_0$ there are first order diffraction signals visible, labeled $a_{-1}$, $a_{+1}$, $b_{-1}$ and $b_{+1}$. Because other quadrants of the illumination aperture are dark, and more generally because the illumination pattern has 180° rotational symmetry, the diffraction orders $a_{-1}$ and $b_{+1}$ are "free" meaning that they do not overlap with the zero order or higher order signals from other parts of the illumination aperture. This property of the segmented illumination pattern can be exploited to obtain clear first order signals from a diffraction grating (alignment mark) having a pitch which is half the minimum pitch that could be imaged if a conventional, circularly-symmetric illumination aperture were used. This diffraction pattern 548' and the manner in which it can be exploited for scatterometry, are described in the known application US 2010/201963. In the interferometer 528 of the alignment sensor optical system 500, a rotated copy of the diffraction pattern 548', illustrated and labeled 548'' in FIG. 5, is also formed and mixed with pattern 548'. These patterns will interfere with each other during the scanning of the alignment mark 202, so as to provide the position signal.

Figure 6:
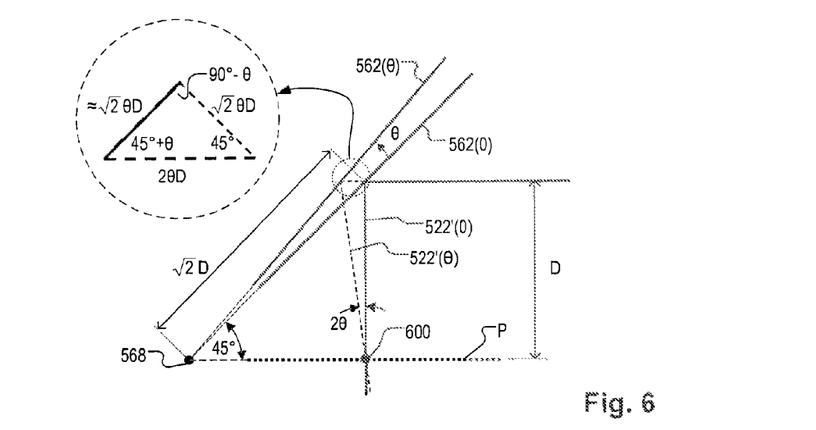
FIG. 6 illustrates a particular geometrical arrangement of a moving mirror in a scanning subsystem of the alignment sensor of FIG. 5.

Concerning the scanning subsystem 560, the particular form of scanning subsystem illustrated here has some beneficial features which will now be described, As seen in FIG. 5 and FIG. 6, the geometry of the mounting of the tilting mirror 562 is such that the pivot point 568 is located in the same plane as the pupil plane P of objective lens 524. Tilting of mirror 562 back and forth is what causes a deviation of the direction of beam 522 as it enters objective lens 524, and consequently causes the back-and-forth scanning movement of spot 506, with the desired velocity $v_{SPOT}$. More specifically, mirror 562 is mounted so as to tilt about an axis which is not within the body of the minor, but is in or close to a line at which the plane of the mirror 562 and the pupil plane P of objective lens 524 intersect. As background, it is desirable that the direction of rays forming the illumination spot 506 should move to implement the scanning velocity $v_{SPOT}$, but without movement of the illumination aperture in the back-projected plane P'. If mirror 562 were to be tilted about, say, its own central axis, as is common for tilting mirrors, then the illumination source would move back and forth in the back-projected pupil plane P', and would result in a varying mean angle-of-incidence of the illumination spot on the substrate.

Better alignment accuracy is obtained by maintaining a normal angle-of-incidence on the substrate. To achieve this, a conventional solution would be to place a tilting mirror in a conjugate pupil plane of an optical system, to achieve a scanning motion of an illumination spot or field of view. In a practical instrument such as the alignment sensor illustrated here, however, a commercially available objective lens 524 is normally housed in a compact and self-contained sub-assembly, and there is no space at the pupil plane P where a tilting mirror or other moving element could be interposed. While a custom-designed assembly can be made which includes a tilting mirror in the pupil plane, or additional optical element can be provided to produce a conjugate pupil plane at a less crowded point in the optical path, the cost of the assembly would become much greater than before, and accuracy may be compromised.

FIG. 6 illustrates the geometry of the ray 522 and the mirror surface 562, firstly for a central or neutral position of the mirror (labeled 562(0)), and then for a deflected position 562(θ), in which the mirror has tilted through an angle θ away from the incoming wave 522, with rotation centered on the pivot point 568, which lies in the same plane as the pupil plane P of objective lens 524. The rest position of the mirror in this example is at 45° to the pupil plane and the incoming ray direction. While the angular movement θ is shown in one direction, the same movement may be imparted to the mirror in the reverse direction (nearer to the source of the ray 522), as mirror 562 oscillates back and forth through a range of angles θ. An enlarged detail within the broken circle shows the geometry in the region where the ray 522 is reflected by mirror 562 in the rest position and the deviated position. The range of angles θ through which the mirror deviates in a practical embodiment may be on the order of millirads or tens of millirads, so that a "small angle approximation" can be applied in calculating the optical path changes caused by the tilting of the mirror. As can be seen in the diagram, pupil plane P and the path of the incoming ray 522 are separated by a distance D, while the default position of mirror 562 is at 45° so as to deflect ray 522 through a right angle. When the mirror tilts by angle θ, the deviated ray 522' tilts by an angle 2θ, but its point of interception with the mirror also shifts to the left by a distance 2θD. Therefore the point 600 at which the deflected ray 522 intercepts the pupil plane P is, at least approximately, independent of the mirror tilt angle θ. From this we know that the effective position of the illumination aperture 548 is unchanged, though the direction of the rays, and hence the position of the illumination spot 506 moves back and forth in accordance with angle θ. (The linear velocity $v_{SPOT}$ is related to the angle 2θ by the magnification factor of objective lens 524.) While the central position of the mirror in this example is at 45°, other angles are possible with the same basic geometry, so as to allow more flexibility in the layout of the optical components. However, 45° is advantageous as it provides the greatest range of tilt for a small movement of the point 600.

The same geometrical arrangement can be applied to include a tilting mirror in an optical system to implement a scanning movement for other applications, besides the alignment sensor of a lithographic apparatus. An example of this may be a confocal microscope, for example. The simple principle by which the mirror is arranged to tilt about an axis which is along the intersection between the plane of the mirror's surface and the pupil plane of the optical system can be applied to obtain the benefits of non-moving illumination in a range of applications, and may be claimed separately.

Figure 7:
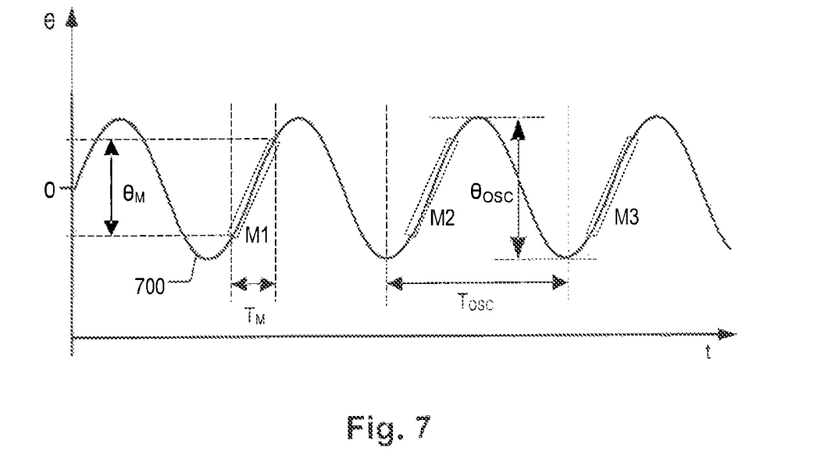
FIG. 7 is a graph of mirror tilt angle against time in a scanning subsystem of the alignment sensor of FIGS. 5 to 6.

FIG. 7 shows a sinusoidal curve 700 which represents the change in tilt angle θ of mirror 562 over time t, in an exemplary embodiment. The trace 700 has a generally sinusoidal form, for the reason that the tilting mirror 562 and its mounting are driven as a resonant vibrator, as mentioned above. In other words, the mirror tilts with simple harmonic motion. The period of the mirror oscillation is labeled $T_{OSC}$ and the amplitude in terms of angle θ of the oscillation is $θ_{OSC}$. An advantage of this drive mode is that it requires minimal energy input, and therefore minimal heat dissipation within the actuator and the mirror mechanism. A disadvantage of this drive mode is that a scanning motion with the desired velocity and direction happens only at certain intervals, and only with limited linearity of motion. With careful design of the measurement process, however, including synchronizing this mirror oscillation with the way the substrate moves during scanning of a series of alignment marks 202 across substrate W, the frequency of the mirror oscillation can be selected so that measurements of alignment mark positions can be made during the intervals labeled M1, M2, M3 in FIG. 7. These are portions of the trace 700 in which the motion of the mirror and hence the movement of spot 506 along the alignment mark 202 are relatively linear and predictable. The range of angles over which scanning measurements take place is labeled $θ_M$ and the time window within which a measurement or measurements can be made using the scanning motion of spot 506 is labeled $T_M$. The apparatus is not limited to measuring one alignment mark during this interval, but could measure several marks, depending on their positions on the substrate W and the motion of the substrate on the substrate table WT.

Figure 8:
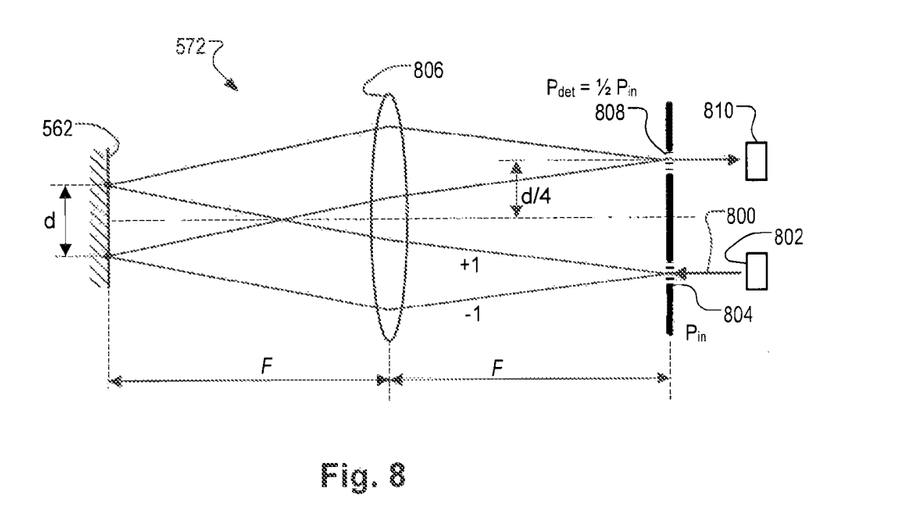
FIG. 8 is a schematic diagram of a tilt sensor associated with the moving mirror in the apparatus of FIG. 5.

FIG. 8 shows schematically the construction and operating principle of tilt sensor 572. As mentioned in relation to FIG. 5, the tilt sensor is provided to provide an accurate measurement of the tilt 562 at all times. This measurement can be used by unit PU or other controller to control and synchronize the scanning movement, the driving via actuator 570, corrections of non-linearity during the measurement periods M1, M2, M3, etc., and other measurements as desired. Tilt sensor 572 is based in this example on the well known phase-grating detector. A radiation beam 800 from a source 802 is diffracted by a first phase-grating having a pitch $P_{IN}$. The phase-grating may be used, so that only first order rays, labeled +1 and −1 in the diagram, are transmitted with any strength. These rays are divergent as shown. A tilt sensor optical system 806 collimates the rays so that they become parallel, so that the +1 and −1 order rays impinge on the surface of the mirror 562 at distinct points, separated by a distance d. (As an example, this distance d may be on the order of millimeters.) The diffracted rays are reflected back through the optical system 806 and focused onto a detection grating 808. Detection grating 808 has a pitch $P_{det}$ which is half that of the input grating 804. A tilt angle in the mirror 562 causes different path lengths for the 30 1 and −1 diffraction orders, affecting their phase when they are recombined at grating 808. A detector 810 receives the diffracted radiation through the detection grating 808. As the mirror tilts one way and then the other, a rapid fluctuation in the intensity of radiation detected at 810 allows counting of very small deviations in the tilt angle. By counting these variations (fringe counting), a very high resolution measurement of tilt can be obtained over a relatively wide range of tilt angles. In order to obtain absolute knowledge of the tilt angle, a number of different grating systems 804, 808 and detectors 810 can be provided in parallel, with different pitches. This approach to disambiguation is well known to the skilled person, and these details will not be described further.

Alternative Embodiments

While the detectors 530a and 530b in the exemplary embodiment are described as image sensors having pixels across their area, alternative embodiments are possible in which detectors are provided at only certain points in the area of the pupil image plane P'''. In particular, alignment signals can be obtained by placing a few detectors at the peripheral positions where the first order diffracted illumination is expected. A set of detectors can be spaced all around the periphery of the pupil image, and signals from appropriate detectors can be selected for processing to generate the position measurements, according to whether the mark 202 is in the X or Y direction, or is an X-Y mark of the type shown in FIG. 2(b).

Figure 9:
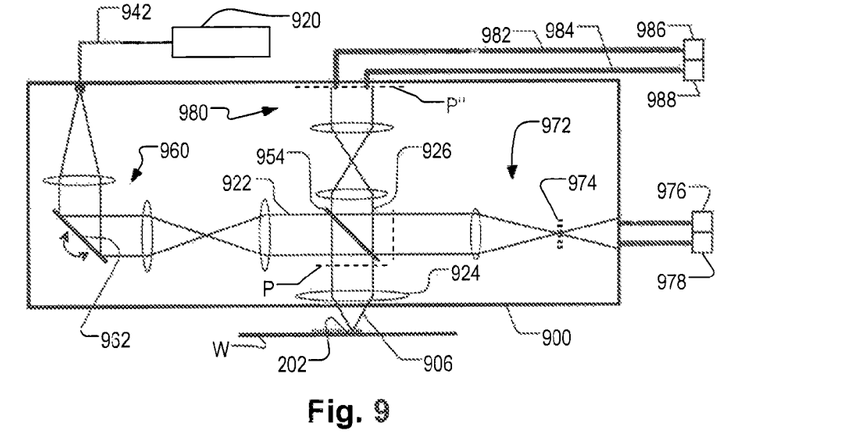
FIG. 9 is a schematic diagram of another novel alignment sensor forming a measuring apparatus in an alternative embodiment of the present invention.

FIG. 9 illustrates an alternative implementation of an alignment sensor using a scanning spot 906. Sensor optical system 900 is based on a different mechanism to that of the sensors shown in FIGS. 3 to 5. A light source 920 is coupled into the alignment sensor optical system via fiber 942. A scanning illumination system 960, which includes a tilting mirror 962, is used to deliver a scanning illumination ray 922 into the spot 906 and on to target alignment mark 202. Mark 202 comprises in its simplest form a detection grating, as in the other embodiments. Information carrying beam 926 is separated from illumination beam 922 via a beam splitter 954. Light diffracted by mark 202 is collimated and the conjugate pupil plane P''' of objective 924 is imaged on an array of detectors. The detector array in this example is represented by just two optical fibers 982, 984 leading to detectors 986, 988. More fibers and detectors can be provided in a practical embodiment, to be selected and/or combined for use in different situations.

The radiation in the plane P''' will contain overlapping diffraction orders that will interfere with each other. If the alignment mark 202 is scanned relative to the measurement spot 906, a periodic intensity variation between the overlapping orders will occur. By use of the tilting mirror 962 to move the spot 906 in a scanning motion synchronously with scanning movement of substrate W beneath the sensor 900, and increased acquisition time can be obtained, limited primarily by the field of view of the objective 924.

Tilt is accurately measured in this embodiment using a reference branch 972 inside the sensor optical system 900. This reference branch is basically a copy of the detection subsystem 980, but with the alignment mark 202 replaced by a fixed and stable reference grating 974. In this example, the reference grating is a transmission grating but, of course, a reflection grating can also be used. Detectors 976, 978 measure the position of the measurement spot relative to grating in the alignment mark 202. Combining information from the four detectors 976, 978, 986, 988, the position of the alignment mark 202 relative to the fixed reference grating 974 can be measured with high accuracy. As a further refinement, one can use a white light source 920, and replace the detectors with spectrometers. This yields spectrally resolved information, while maintaining a high measurement throughput. Alternatively, several individual wavelengths of light can be used which are multiplexed and de-multiplexed in the optical system hardware. (Similar modifications can be envisaged in the embodiment of FIGS. 5 to 8 also.)

FIG. 10 illustrates a further alternative implementation of an alignment sensor with a scanning spot. In this example, the alignment sensor optical system is divided into a stationary part housed in body 1002, comprising an interferometer 1028, and a moving part housed in a sub-chassis 1004. In this example, the functioning of the alignment sensor 1000 is generally the same as that of FIGS. 3 and 5, but the scanning of illumination spot 1006 is achieved by putting the objective 1024 in the moving sub-chassis 1004. The sub-division of the optical system into moving and stationary parts allows the mass of the moving part, and consequently potential sources of vibration, heat dissipation etc., to be less than that of the whole alignment sensor optical system. The moving part may be connected to the fixed part via leaf springs, and actuators such as piezo or Lorentz actuators can be used to move the sub-chassis 1004 with the desired scanning velocity $v_{SPOT}$.

As in the other embodiments, it becomes important to know and control the exact position of the moving part relative to the fixed part of the sensor 1000. Therefore a number of position encoders are provided to measure and control natural translation and any spurious rotation of the moving sub-chassis 1004 relative to the fixed chassis 1002, which is connected to reference frame RF of the lithographic apparatus (FIG. 1), It may be noted that the special segmented illumination aperture illustrated in FIG. 5 becomes particularly useful in this embodiment, because there is no need to maintain accurate positioning of a zero order stop, which is part of the known alignment sensor of FIG. 3.

Numerous modifications and variations of the embodiments described above can be envisaged by the skilled reader, without departing from the scope of the present invention. As mentioned, for example, the alignment sensors shown can be adapted for use with the mark of FIG. 2(*b*) to obtain simultaneously positioned information in X and Y directions. If it is desired to use the segmented illumination aperture 548 in such an embodiment, the illumination aperture 548 should be rotated so that the bright segments a and b are at 45° to both X and Y axes, just as the grating lines in the mark 210 (FIG. 2(*b*)) are arranged at 45° also.

In this simple example, the oscillating mirror 562 only moves the spot in one dimension, and only one direction of marks can be scanned with the reduced effective velocity. If two-dimensional scanning is required, one can either use two separate mirrors with orthogonal pivot axes, or one mirror that can tilt around 2 orthogonal pivots. The skilled reader can extend the example to two dimensions in either way.

As mentioned in the introduction and elsewhere, certain features disclosed in the context of the alignment sensor with scanning illumination spot 406, 506 etc., can be used independently in other applications. The segmented aperture, combined with detection in the conjugate pupil plane which is a feature of the embodiment of FIG. 5 can be used in an alignment sensor without any scanning subsystem 560. As mentioned already, use of such an aperture allows denser grating lines to be used in the alignment mark, potentially improving positional accuracy and/or reducing the substrate area required by the mark.

Similarly, the provision of an oscillating mirror whose pivot axis is displaced so at the lie in the same plane as the mirror and a pupil plane of the optical system in which it is used, can be used to deflect an illumination spot in a substrate plane, without moving the apparent position of the illumination source.

It should be understood that the processing unit PU which controls alignment sensor, processes signals detected by it, and calculates from these signals position measurements suitable for use in controlling the lithographic patterning process, will typically involve a computer assembly of some kind, which will not be described in detail. The computer assembly may be a dedicated computer external to the apparatus, it may be a processing unit or units dedicated to the alignment sensor or, alternatively, it may be a central control unit LACU controlling the lithographic apparatus as a whole. The computer assembly may be arranged for loading a computer program product comprising computer executable code. This may enable the computer assembly, when the computer program product is downloaded, to control aforementioned uses of a lithographic apparatus with the alignment sensor AS.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. W sere applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method measuring a position of a mark on a substrate in an optical apparatus, the method comprising:
   providing a mark on the substrate;
   providing a measurement optical system comprising an illumination subsystem configured to illuminate the mark with a spot of radiation and a detecting subsystem configured to detect radiation diffracted by the mark;
   in a scanning operation moving the substrate and the measurement optical system relative to one another at a first velocity so as to scan the mark with the spot of radiation while detecting and processing signals representing the diffracted radiation to calculate a position of the mark relative to a reference frame of the measurement optical system; and
   synchronously with said scanning operation, moving the spot of radiation relative to the reference frame of the measurement optical system at a second velocity, the first and second velocities being related such that the spot scans the mark at a third velocity which is lower than the first velocity while said signals are detected.

2. The method of claim 1 wherein said first and second velocities are parallel, with the second velocity being lower than the first velocity, and the third velocity being equal to the first velocity minus the second velocity.

3. The method of claim 1 wherein said radiation spot is delivered to the substrate via an objective lens fixed in relation to the reference frame of the measurement optical system.

4. The method of claim 3 wherein the movement of the radiation spot relative to the reference frame of the measurement optical system is imparted by a moving optical element within the measurement optical system.

5. The method of claim 4 wherein said moving optical element is a mirror mounted to tilt about an axis, and wherein the axis lies at least approximately at the intersection of a plane of the mirror and a pupil plane of the objective lens.

6. The method of claim 4, wherein the moving optical element is mounted and driven so as to oscillate substantially in simple harmonic motion, said scanning operation being performed during a relatively linear portion of said simple harmonic motion.

7. The method of claim 1, wherein said illumination subsystem imparts a pattern of illumination that is not circularly symmetric about an optical axis of the measurement optical system, but exhibits 180° rotational asymmetry.

8. The method of claim 7, wherein the detection subsystem calculates the position of the mark using first order diffracted radiation detected in a conjugate pupil plane of the measurement optical system.

9. An apparatus for measuring positions of marks on a substrate, the apparatus comprising:
   a measurement optical system comprising an illumination subsystem configured to illuminate the mark with a spot of radiation and a detecting subsystem configured to detect radiation diffracted by the mark;
   a first positioning subsystem configured to control movement of the substrate and measurement optical system relative to one another at a first velocity so as to scan the mark with the spot of radiation while detecting and processing signals representing the diffracted radiation to calculate a position of the mark relative to a reference frame of the measurement optical system;
   a second positioning subsystem operable synchronously with the first positioning subsystem configured to move the spot of radiation relative to the reference frame of the measurement optical system at a second velocity, the first and second velocities being related such that the spot scans the mark at a third velocity which is lower than the first velocity while said signals are detected.

10. The apparatus of claim 9, wherein in operation said first and second velocities are parallel, with the second velocity being lower than the first velocity, and the third velocity being equal to the first velocity minus the second velocity.

11. The apparatus of claim 9, wherein said measurement optical system includes an objective lens for delivering said radiation spot to the substrate, the objective lens remaining fixed in relation to the reference frame of the measurement optical system.

12. The apparatus of claim 11, wherein the second positioning subsystem comprises a moving optical element within the measurement optical system for imparting the movement of the radiation spot relative to the reference frame of the measurement optical system.

13. The apparatus of claim 12, wherein said moving optical element is a mirror mounted to tilt about an axis, and wherein the axis lies at least approximately at the intersection of a plane of the mirror and a pupil plane of the objective lens.

14. The apparatus of claim 12, wherein the moving optical element is mounted so as to oscillate with a resonant frequency substantially matched to the second velocity.

15. The apparatus of claim 9, wherein said illumination sub-system is operable to impart a pattern of illumination which is not circularly symmetric about an optical axis of the measurement optical system, but exhibits 180° rotational asymmetry.

16. The apparatus of claim 15, wherein the detection subsystem is arranged to calculate the position of the mark using first order diffracted radiation detected in a conjugate pupil plane of the measurement optical system.

17. The apparatus of claim 9, wherein the measurement optical system includes a self-referencing interferometer for rotating and recombining two portions of the diffracted radiation.

18. A lithographic apparatus arranged to transfer a pattern from a patterning device onto a substrate, the apparatus comprising:
   a substrate table constructed to hold a substrate and an alignment sensor configured to measure the positions of marks on the substrate relative to a reference frame of the lithographic apparatus,
   wherein the alignment sensor comprises a measuring apparatus having:
      a measurement optical system comprising an illumination subsystem configured to illuminate the mark with a spot of radiation and a detecting subsystem configured to detect radiation diffracted by the mark;
      a first positioning subsystem configured to control movement of the substrate and measurement optical system relative to one another at a first velocity so as to scan the mark with the spot of radiation while detecting and processing signals representing the diffracted radiation to calculate a position of the mark relative to a reference frame of the measurement optical system;

a second positioning subsystem operable synchronously with the first positioning subsystem configured to move the spot of radiation relative to the reference frame of the measurement optical system at a second velocity, the first and second velocities being related such that the spot scans the mark at a third velocity which is lower than the first velocity while said signals are detected, and wherein the lithographic apparatus is arranged to control the transfer of a pattern onto the substrate by reference to the positions of marks on the substrate measured using said measuring apparatus.

* * * * *